(12) United States Patent
Xu et al.

(10) Patent No.: US 6,656,837 B2
(45) Date of Patent: Dec. 2, 2003

(54) METHOD OF ELIMINATING PHOTORESIST POISONING IN DAMASCENE APPLICATIONS

(75) Inventors: Ping Xu, Fremont, CA (US); Li-Qun Xia, Santa Clara, CA (US); Larry A. Dworkin, Sunnyvale, CA (US); Mehul Naik, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/977,008

(22) Filed: Oct. 11, 2001

(65) Prior Publication Data

US 2003/0077916 A1 Apr. 24, 2003

(51) Int. Cl.[7] ............................................. H01L 21/44
(52) U.S. Cl. ..................................................... 438/676
(58) Field of Search ................................ 438/623, 627, 438/676, 687, 931, 780

(56) References Cited

U.S. PATENT DOCUMENTS

| | | | |
|---|---|---|---|
| 4,532,150 A | 7/1985 | Endo et al. ................... 427/39 |
| 5,000,819 A | 3/1991 | Pedder et al. ................ 156/643 |
| 5,232,871 A | 8/1993 | Ho ................................ 437/190 |
| 5,314,724 A | 5/1994 | Tsukune et al. ............. 427/489 |
| 5,362,526 A | 11/1994 | Wang et al. ................. 427/573 |
| 5,409,543 A | 4/1995 | Panitz et al. ..................... 134/2 |
| 5,423,941 A | 6/1995 | Komura et al. ........... 156/643.1 |
| 5,427,621 A | 6/1995 | Gupta ............................. 134/1 |
| 5,451,263 A | 9/1995 | Linn et al. .................... 134/1.1 |
| 5,525,550 A | 6/1996 | Kato ............................ 437/238 |
| 5,554,570 A | 9/1996 | Maeda et al. ................ 437/235 |
| 5,593,741 A | 1/1997 | Ikeda ........................... 427/579 |
| 5,618,619 A | 4/1997 | Petrmichl et al. ........... 428/334 |
| 5,627,105 A | 5/1997 | Delfino et al. .............. 438/627 |
| 5,660,682 A | 8/1997 | Zhao et al. .................. 438/715 |
| 5,679,413 A | 10/1997 | Petrmichl et al. ........... 427/534 |
| 5,711,987 A | 1/1998 | Bearinger et al. .............. 427/7 |
| 5,726,097 A | 3/1998 | Yanagida ..................... 438/622 |
| 5,741,626 A | 4/1998 | Jain et al. .................... 430/314 |
| 5,780,163 A | 7/1998 | Camilletti et al. .......... 428/446 |
| 5,801,098 A | 9/1998 | Fiordalice et al. .......... 438/653 |
| 5,818,071 A | 10/1998 | Loboda et al. ................. 257/77 |
| 5,821,168 A | 10/1998 | Jain ............................. 438/692 |

(List continued on next page.)

FOREIGN PATENT DOCUMENTS

| | | | | |
|---|---|---|---|---|
| EP | 0 725 440 A2 | 8/1996 | ......... | H01L/23/532 |
| JP | 06-204191 | 7/1994 | ......... | H01L/21/302 |
| WO | 99/33102 | 7/1998 | ......... | H01L/21/768 |

OTHER PUBLICATIONS

Huang., "Plasma treatment to enhance adhesion and to minimize oxidation of carbon–containing layers" US 2002/0054962 A1.*

(List continued on next page.)

Primary Examiner—Hoai Ho
Assistant Examiner—Quoc Huang
(74) Attorney, Agent, or Firm—Moser, Patterson & Sheridan (57) ABSTRACT

A method is provided for processing a substrate including treating a surface of a dielectric layer comprising silicon and carbon by exposing the dielectric layer comprising silicon and carbon to a plasma of an inert gas, and depositing a photoresist on the dielectric layer comprising silicon and carbon. The dielectric layer may comprise a first dielectric layer comprising silicon, carbon, and nitrogen, and a second layer of nitrogen-free silicon and carbon containing material in situ on the first dielectric layer, and a third dielectric layer comprising silicon, oxygen, and carbon on the second dielectric layer.

17 Claims, 5 Drawing Sheets

U.S. PATENT DOCUMENTS

| | | | |
|---|---|---|---|
| 5,926,740 A | | 7/1999 | Forbes et al. ............... 438/763 |
| 6,103,456 A | * | 8/2000 | Tobben et al. |
| 6,107,192 A | | 8/2000 | Subrahmanyan et al. ... 438/637 |
| 6,114,259 A | | 9/2000 | Sukharev et al. ........... 438/789 |
| 6,140,226 A | | 10/2000 | Grill et al. .................. 438/637 |
| 6,147,009 A | | 11/2000 | Grill et al. .................. 438/780 |
| 6,159,871 A | | 12/2000 | Loboda et al. .............. 438/786 |
| 6,303,523 B2 | * | 10/2001 | Cheung et al. .............. 438/780 |
| 6,372,661 B1 | * | 4/2002 | Lin et al. .................... 438/769 |
| 6,410,437 B1 | | 6/2002 | Flanner et al. .............. 438/689 |
| 6,429,121 B1 | | 8/2002 | Hopper et al. .............. 438/636 |
| 6,436,824 B1 | | 8/2002 | Chooi et al. ................ 438/687 |
| 6,489,238 B1 | * | 12/2002 | Tsui ........................... 438/676 |
| 6,495,448 B1 | | 12/2002 | Lee ............................ 438/624 |
| 6,528,426 B1 | | 3/2003 | Olsen et al. ................. 438/689 |
| 6,534,397 B1 | | 3/2003 | Okada et al. ............... 438/633 |
| 2002/0173172 A1 | | 11/2002 | Loboda et al. .............. 438/786 |
| 2002/0187629 A1 | | 12/2002 | Huang et al. ............... 438/624 |
| 2003/0008511 A1 | | 1/2003 | Tsai et al. ................... 438/694 |

OTHER PUBLICATIONS

Swope, et al., "Improvement of Adhesion Properties of Fluorinated Silica Glass Films by Nitrous Oxide Plasma Treatment" *J. Electrochem Soc.* 144(7) (Jul. 1977), pp. 2559–2564.

Takeishi, et al., Stabilizing Dielectric Constants of Fluorine–Doped $SiO_2$ Films by $N_2O$–Plasma Annealing, *J. Electrochem. Soc.* 143(1) (Jan. 1996), pp. 381–384.

Ogawa, et al., "Novel ARC Optimization Methodology for KrF Excimer Laser Lithography at Low K1 Factor", Proceedings of the SPIE Optical/Laser Microlithography V, vol. 1674 (1992), pp. 362–375.

Dijkstra, et al., "Optimization of Anti_reflection Layers for Deep UV Lithography", Proceedings of SPIE Optical/Laser Microlithography VI, vol. 1927 (1993) pp. 275–286.

USSN 09/270,039, filed Mar. 16, 1999.

* cited by examiner

METHOD OF ELIMINATING PHOTORESIST POISONING IN DAMASCENE APPLICATIONS

BACKGROUND OF THE DISCLOSURE

1. Field of the Invention

The invention relates to the fabrication of integrated circuits and to a process for depositing dielectric layers on a substrate and the structures formed by the dielectric layer.

2. Description of the Related Art

One of the primary steps in the fabrication of modern semiconductor devices is the formation of metal and dielectric layers on a substrate by chemical reaction of gases. Such deposition processes are referred to as chemical vapor deposition or CVD. Conventional thermal CVD processes supply reactive gases to the substrate surface where heat-induced chemical reactions take place to produce a desired layer.

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 $\mu$m and even 0.18 $\mu$m feature sizes, and tomorrow's plants soon will be producing devices having even smaller geometries.

To further reduce the size of devices on integrated circuits, it has become necessary to use conductive materials having low resistivity and to use insulators having low dielectric constants (dielectric constant <4.0) to also reduce the capacitive coupling between adjacent metal lines. One such low k material is spin-on glass, such as un-doped silicon glass (USG) or fluorine-doped silicon glass (FSG), which can be deposited as a gap fill layer in a semiconductor manufacturing process and silicon oxycarbide which can used as a dielectric layer in fabricating damascene features.

One conductive material gaining acceptance is copper and its alloys, which have become the materials of choice for sub-quarter-micron interconnect technology because copper has a lower resistivity than aluminum, (1.7 $\mu\Omega$-cm compared to 3.1 $\mu\Omega$-cm for aluminum), a higher current and higher carrying capacity. These characteristics are important for supporting the higher current densities experienced at high levels of integration and increased device speed. Further, copper has a good thermal conductivity and is available in a highly pure state.

One difficulty in using copper in semiconductor devices is that copper is difficult to etch and achieve a precise pattern. Etching with copper using traditional deposition/etch processes for forming interconnects has been less than satisfactory. Therefore, new methods of manufacturing interconnects having copper containing materials and low k dielectric materials are being developed.

One method for forming vertical and horizontal interconnects is by a damascene or dual damascene method. In the damascene method, one or more dielectric materials, such as the low k dielectric materials, are deposited and pattern etched to form the vertical interconnects, i.e. vias, and horizontal interconnects, i.e., lines. Conductive materials, such as copper containing materials, and other materials, such as barrier layer materials used to prevent diffusion of copper containing materials into the surrounding low k dielectric, are then inlaid into the etched pattern. Any excess copper containing materials and excess barrier layer material external to the etched pattern, such as on the field of the substrate, is then removed.

However, when silicon oxycarbide layers or silicon carbide layers are used as the low k material in damascene formation, it has been difficult to produced aligned features with little or no defects. It as been observed that photoresist materials deposited on the silicon oxycarbide layers or the silicon carbide layers may be contaminated with nitrogen deposited with those layers or nitrogen that diffuses through those layers. For example, reaction of organosilicon compounds with nitrous oxide can contaminate the silicon oxycarbide layer with nitrogen. Photoresist materials contaminated with nitrogen becomes less sensitive to radiation. Any photoresist material that is not sensitive to radiation is not removed by subsequent photoresist stripping processes and remains as residue. This residue can result in detrimentally affecting subsequent etching processes and result in misaligned and malformed features.

Therefore, there remains a need for an improved process for depositing photoresist material on silicon oxycarbide or silicon carbide dielectric layers.

SUMMARY OF THE INVENTION

Aspects of the invention generally provide a method for depositing a silicon oxycarbide layer or silicon carbide layer having a low dielectric constant with reduced photoresist poisoning. In one aspect, the invention provides a method for processing a substrate including depositing a dielectric layer containing silicon and carbon, treating a surface of the dielectric layer comprising silicon and carbon by exposing the dielectric layer to a plasma of an inert gas, and depositing a photoresist on the dielectric layer.

The method may further include patterning and etching the photoresist layer to expose the dielectric layer comprising silicon and carbon, and then etching the dielectric layer to form at least a portion of a damascene definition prior to depositing one or more conductive materials in the damascene definition to form a damascene structure. The dielectric layer may have a carbon content between about 5 and about 30 atomic percent excluding hydrogen atoms. The silicon and carbon containing layer can be an amorphous silicon carbide layer that may be doped with oxygen, nitrogen, or both or a silicon oxycarbide layer doped with nitrogen.

In another aspect of the invention, a method is provided for processing a substrate including depositing a first dielectric layer comprising silicon, carbon, and nitrogen, depositing a nitrogen-free silicon and carbon containing material in situ on the dielectric layer, depositing a second dielectric layer comprising silicon, oxygen, and carbon on the nitrogen-free silicon and carbon containing material by chemical vapor deposition, and depositing a photoresist on the second dielectric layer.

BRIEF DESCRIPTION OF THE DRAWINGS

So that the manner in which the above aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

For a further understanding of aspect of the invention, reference should be made to the ensuing detailed description.

DETAILED DESCRIPTION OF THE PREFERRED EMBODIMENTS

Aspects of the invention described herein refer to a method and apparatus for depositing a silicon and carbon containing layer having a low dielectric constant, such as a silicon oxycarbide dielectric layer or a silicon carbide dielectric layer and treating the surface of a silicon and carbon containing layer before depositing a photoresist material thereon. Treating of the surface of the silicon and carbon containing material is believed to remove nitrogen contaminants from the deposited material or limit the ability of nitrogen from reacting with the photoresist material. Treating the surface may include plasma treatment or deposition of a passivation layer thereon. The treated surface has been observed to be less reactive with the subsequently deposited photoresist material thereby limiting photoresist poisoning and reduce defect formation when forming features in the dielectric layer.

The silicon and carbon containing layer may comprise a silicon carbide dielectric layer or a silicon oxycarbide layer. The silicon carbide layer may also contain hydrogen, oxygen, nitrogen, or combinations thereof. Oxygen doped silicon carbide generally includes less than about 15 atomic percent (atomic %) of oxygen or less, preferably about 10 atomic % or less of oxygen. The silicon carbide layer may be a barrier layer disposed adjacent a conductive material or a dielectric layer or may be an etch stop deposited between one or more dielectric layers. The silicon oxycarbide layer generally comprises between about 15 atomic % or greater of oxygen in the layer. The silicon oxycarbide layer may also contain hydrogen, nitrogen, or combinations thereof.

The silicon carbide layer or silicon oxycarbide layer is deposited by reacting an organosilicon compound to form a dielectric layer comprising carbon-silicon bonds and a dielectric constant less than about 3. The silicon oxycarbide layer can also be an intermetal dielectric layer deposited on or before a silicon carbide layer.

The silicon and carbon containing layer is preferably an amorphous hydrogenated silicon carbide. The amorphous silicon carbide layer is produced by the reaction of an organosilane compound, or a carbon containing material and a silicon containing material, in a plasma of an inert gas. Oxygen or a nitrogen source, such as ammonia, may also be present during the reaction to form the oxygen and nitrogen doped silicon carbide layers respectively.

Suitable organosilane compounds include aliphatic organosilicon compounds, cyclic organosilicon compounds, or combinations thereof. Cyclic organosilicon compounds typically have a ring comprising three or more silicon atoms and the ring may further comprise one or more oxygen atoms. Commercially available cyclic organosilicon compounds include rings having alternating silicon and oxygen atoms with one or two alkyl groups bonded to the silicon atoms.

Aliphatic organosilicon compounds have linear or branched structures comprising one or more silicon atoms and one or more carbon atoms, and the structure may further comprise oxygen. Commercially available aliphatic organosilicon compounds include organosilanes that do not contain oxygen between silicon atoms and organosiloxanes that contain oxygen between two or more silicon atoms.

The carbon content of the deposited layers refers to atomic analysis of the layer structure that typically does not contain significant amounts of non-bonded hydrocarbons. The carbon contents are represented by the percent of carbon atoms in the deposited layer, excluding hydrogen atoms that are difficult to quantify. For example, a layer having an average of one silicon atom, one oxygen atom, one carbon atom, and two hydrogen atoms has a carbon content of 20 atomic percent (one carbon atom per five total atoms), or a carbon content of 33 atomic percent excluding hydrogen atoms (one carbon atom per three total atoms).

Organosilicon compounds contain carbon atoms in organic groups. Low dielectric constant layers are prepared from organosilicon compounds that have one or more carbon atoms attached to silicon wherein the carbon is not readily removed by oxidation at suitable processing conditions. Organic groups may include alkyl, alkenyl, cyclohexenyl, and aryl groups in addition to functional derivatives thereof.

Cyclic organosilicon compounds include, for example, one or more of the following compounds:

1,3,5-trisilano-2,4,6-trimethylene, —(—SiH$_2$CH$_2$—)$_3$— (cyclic)

2,4,6,8-tetramethylcyclotetrasiloxane (TMCTS) —(—SiHCH$_3$—O—)$_4$— (cyclic)

octamethylcyclotetrasiloxane (OMCTS), —(—Si(CH$_3$)$_2$—O—)$_4$— (cyclic)

2,4,6,8,10-pentamethylcyclopentasiloxane, —(—SiHCH$_3$—O—)$_5$— (cyclic)

1,3,5,7-tetrasilano-2,6-dioxy-4,8-dimethylene, —(—SiH$_2$—CH$_2$—SiH$_2$—O—)$_2$— (cyclic)

hexamethylcyclotrisiloxane —(—Si(CH$_3$)$_2$—O—)$_3$— (cyclic)

Aliphatic organosilicon compounds include for example, one or more of the following compounds:

methylsilane, CH$_3$—SiH$_3$
dimethylsilane, (CH$_3$)$_2$—SiH$_2$
trimethylsilane, (CH$_3$)$_3$—SiH
dimethyldimethoxysilane, (CH$_3$)$_2$—Si—(OCH$_3$)$_2$
ethylsilane, CH$_3$—CH$_2$—SiH$_3$
disilanomethane, SiH$_3$—CH$_2$—SiH$_3$
bis(methylsilano)methane, CH$_3$—SiH$_2$—CH$_2$—SiH$_2$—CH$_3$
1,2-disilanoethane, SiH$_3$—CH$_2$—CH$_2$—SiH$_3$
1,2-bis(methylsilano)ethane, CH$_3$—SiH$_2$—CH$_2$—CH$_2$—SiH$_2$—CH$_3$
2,2-disilanopropane, SiH$_3$-C(CH$_3$)$_2$—SiH$_3$
1,3-dimethyldisiloxane, CH$_3$—SiH$_2$—O—SiH$_2$—CH$_3$
1,1,3,3-tetramethyldisiloxane, (CH$_3$)$_2$—SiH—O—SiH—(CH$_3$)$_2$
hexamethyldisiloxane (HMDS), (CH$_3$)$_3$—Si—O—Si—(CH$_3$)$_3$ 1,3-bis(silanomethylene)disiloxane, ($SiH_3$—$CH_2$—$SiH_2$—)$_2$—O bis(1-methyldisiloxanyl)methane, ($CH_3$—$SiH_2$—O—$SiH_2$—)$_2$—$CH_2$ 2,2-bis(1-methyldisiloxanyl)propane, ($CH_3$—$SiH_2$—O—$SiH_2$—)$_2$—$C(CH_3)_2$, and hexamethoxydisiloxane (HMDOS) ($CH_3O)_3$—Si—O—Si—($OCH_3)_3$.

The above list is illustrative and should not be construed or interpreted as limiting the scope of the invention.

In one aspect, a cyclic organosilicon compound and an aliphatic organosilicon compound are reacted with an oxidizing gas in amounts sufficient to deposit a low dielectric constant layer on a semiconductor substrate, wherein the cyclic organosilicon compound comprises at least one silicon-carbon bond. The aliphatic organosilicon compound contains a silicon-hydrogen bond or a silicon-oxygen bond, preferably a silicon-hydrogen bond. For example, the cyclic organosilicon compound may be 1,3,5,7-tetramethylcyclotetrasiloxane or octamethylcyclotetrasiloxane and the aliphatic organosilicon compound may be trimethylsilane or 1,1,3,3-tetramethyldisiloxane.

In another aspect, both the cyclic organosilicon compound and the aliphatic organosilicon compound contain a silicon-hydrogen bond. For example, 1,3,5,7-tetramethylcyclotetrasiloxane and trimethylsilane or 1,1,3,3-tetramethyldisiloxane are blended and oxidized while applying RF power.

Generally, the organosilicon compounds are reacted in a plasma comprising a relatively inert gas, preferably a noble gas, such as helium or argon, or nitrogen ($N_2$). The deposited silicon carbide layers have dielectric constants of about 5 or less, and the silicon oxycarbide layers may have dielectric constants of about 3 or less.

A preferred silicon carbide layer is deposited in one embodiment by supplying trimethylsilane to a plasma processing chamber at a flow rate between about 10 and about 1000 standard cubic centimeters per minute (sccm). An inert gas, such as helium, argon, or combinations thereof, is also supplied to the chamber at a flow rate between about 50 sccm and about 5000 sccm. The chamber pressure is maintained between about 100 milliTorr and about 15 Torr. The substrate surface temperature is maintained between about 100° C. and about 450° C. during the deposition process.

Alternatively, a doped silicon carbide layer can be deposited by introducing oxygen and/or a nitrogen source, or other dopant, into the processing chamber at a flow rate between about 50 sccm and about 10,000 sccm. For example, a nitrogen containing or nitrogen doped silicon carbide layer may be deposited by introducing a nitrogen source, such as ammonia, nitrogen, a mixture of nitrogen and hydrogen, or combinations thereof, during deposition. An example process for depositing a nitrogen containing silicon carbide layer is disclosed in U.S. patent application Ser. No. 09/793,818, filed on Feb. 23, 2001, which is incorporated by reference to the extent not inconsistent with the claims and disclosure described herein.

The organosilicon compound, inert gas, and optional dopant, are introduced to the processing chamber via a gas distribution plate spaced between about 200 millimeters (mm) and about 600 millimeters from the substrate on which the silicon carbide layer is being deposited upon. Power from a single 13.56 MHz RF power source is supplied to the chamber 10 to form the plasma at a power density between about 0.3 watts/$cm^2$ and about 3.2 watts/$cm^2$, or a power level between about 100 watts and about 1000 watts for a 200 mm substrate. A power density between about 0.9 watts/$cm^2$ and about 2.3 watts/$cm^2$, or a power level between about 300 watts and about 700 watts for a 200 mm substrate, is preferably supplied to the processing chamber to generate the plasma.

Additionally, the ratio of the silicon source to the dopant in the gas mixture should have a range between about 1:1 and about 100:1. The above process parameters provide a deposition rate for the silicon carbide layer in a range between about 100 Å/min and about 3000 Å/min when implemented on a 200 mm (millimeter) substrate in a deposition chamber available from Applied Materials, Inc., located in Santa Clara, Calif.

The embodiments described herein for depositing silicon carbide layers are provided to illustrate the invention, the particular embodiment shown should not be used to limit the scope of the invention. The invention also contemplates other processes and materials used to deposit silicon carbide layers.

A preferred silicon oxycarbide layer comprises silicon-oxygen bonds and silicon-carbon bonds that contribute to low dielectric constants and barrier properties. The carbon content of the deposited layer is between about 5 and about 30 atomic percent excluding hydrogen atoms, and is preferably between about 10 and about 20 atomic percent excluding hydrogen atoms. The deposited layers may contain C—H or C—F bonds throughout to provide hydrophobic properties to the silicon oxycarbide layer.

The silicon oxycarbide layers are produced from organosilicon compounds containing carbon in organo groups that are not readily removed by oxidation at processing conditions. Suitable organosilicon compounds were described above and include aliphatic organosilicon compounds, cyclic organosilicon compounds, or combinations thereof. For example, suitable organo groups include alkyl, alkenyl, cyclohexenyl, and aryl groups and functional derivatives.

In a preferred aspect of the invention, the silicon oxycarbide layer is deposited by reacting an organosilicon compound comprising three or more alkyl groups with an oxidizing gas comprising ozone. The silicon oxycarbide layer may be deposited without an oxidizer if the organosilicon compound includes oxygen. The preferred organosilicon compounds include, for example:

trimethylsilane, ($CH_3)_3$—SiH tetramethylsilane, ($CH_3)_4$—Si 1,1,3,3-tetramethyldisiloxane, ($CH_3)_2$—SiH—O—SiH—($CH_3)_2$ hexamethyldisiloxane, ($CH_3)_3$—Si—O—Si—($CH_3)_3$ 2,2-bis(1-methyldisiloxanyl)propane, ($CH_3$—$SiH_2$—O—$SiH_2$—)$_2$—$C(CH_3)_2$ 1,3,5,7-tetramethylcyclotetrasiloxane, —(—$SiHCH_3$—O—)$_4$— (cyclic)

octamethylcyclotetrasiloxane, —(—$Si(CH_3)_2$—O—)$_4$— (cyclic)

1,3,5,7,9-pentamethylcyclopentasiloxane, —(—$SiHCH_3$—O—)$_5$— (cyclic)

and fluorinated derivatives thereof.

The organosilicon compounds are oxidized during deposition of the silicon oxycarbide layer, preferably by reaction with oxygen ($O_2$), ozone ($O_3$), nitrous oxide ($N_2O$), carbon monoxide (CO), carbon dioxide ($CO_2$), water ($H_2O$), or combinations thereof. When ozone is used as an oxidizing gas, an ozone generator typically converts about 15 wt. % of the oxygen in a source gas to ozone, with the remainder typically being oxygen. However, the ozone concentration may be increased or decreased based upon the amount of ozone desired and the type of ozone generating equipment used. Organosilicon compounds that contain oxygen may be disassociated to provide the oxygen. During deposition of the silicon oxycarbide layer, the substrate is maintained at a temperature between about −20° C. and about 500° C., and preferably is maintained at a temperature between about 170° C. and about 180° C.

For a plasma enhanced deposition of the silicon oxycarbide layer, the organosilicon material is deposited using a power density ranging between about 0.03 W/cm$^2$ and about 6.4 W/cm$^2$, which is a RF power level of between about 10 W and about 2000 W for a 200 mm substrate. Preferably, the RF power level is between about 300 W and about 1700 W. The RF power is provided at a frequency between about 0.01 MHz and 300 MHz. The RF power may be provided continuously or in short duration cycles wherein the power is on at the stated levels for cycles less than about 200 Hz and the on cycles total between about 10% and about 50% of the total duty cycle. The deposition process of the low dielectric constant layer is performed in a substrate processing system described in more detail below. The silicon oxycarbide layer can be deposited continuously or with interruptions, such as changing chambers or providing cooling time, to improve porosity.

In one embodiment of plasma enhanced deposition, oxygen or oxygen containing compounds are dissociated to increase reactivity and achieve desired oxidation of the deposited layer. RF power is coupled to the deposition chamber to increase dissociation of the compounds. The compounds may also be dissociated in a microwave chamber prior to entering the deposition chamber.

Although deposition preferably occurs in a single deposition chamber, the silicon oxycarbide layer can be deposited sequentially in two or more deposition chambers, e.g., to permit cooling of the layer during deposition. Additionally, the silicon oxycarbide and silicon carbide layers may be deposited in situ in the same chamber and deposited subsequently by using selective precursors and controlling the processing parameters and the composition of processing gases. For example, both the silicon carbide an silicon oxycarbide layer may be deposited using trimethylsilane with ammonia being used in the silicon carbide deposition to form a nitrogen doped silicon carbide, and subsequently using ozone during deposition of the silicon oxycarbide material.

Following deposition, the deposited dielectric material may be annealed at a temperature between about 100° C. and about 400° C. for between about 1 minute and about 60 minutes, preferably at about 30 minutes, to reduce the moisture content and increase the solidity and hardness of the dielectric material, if desired. The anneal is preferably performed after the deposition of the next layer which prevents shrinkage or deformation of the dielectric layer. Inert gases, such as argon and helium, may be added to the annealing atmosphere.

The deposited silicon oxycarbide layer or silicon carbide layer is plasma treated prior to deposition of photoresist materials thereon. The plasma treatment is believed to remove a portion of the carbon material from the surface of the silicon oxycarbide layer or silicon carbide layer that reduces the surface's reactivity to subsequently deposited materials. The plasma treatment may be performed in the same chamber used to deposit the silicon and carbon containing material.

The plasma treatment generally includes providing an inert gas including helium, argon, neon, xenon, krypton, or combinations thereof, to a processing chamber at a flow rate between about 500 sccm and about 3000 sccm, and generating a plasma in the processing chamber. The plasma may be generated using a power density ranging between about 0.03 W/cm$^2$ and about 3.2 W/cm$^2$, which is a RF power level of between about 10 W and about 1000 W for a 200 mm substrate. Preferably, a power level of between about 200 watts and about 800 watts is used in depositing the silicon carbide material for a 200 mm substrate. The RF power can be provided at a high frequency such as between 13 MHz and 14 MHz. The RF power can be provided continuously or in short duration cycles wherein the power is on at the stated levels for cycles less than about 200 Hz and the on cycles total between about 10% and about 30% of the total duty cycle.

The processing chamber is generally maintained at a chamber pressure of between about 3 Torr and about 12 Torr. A chamber pressure between about 7 Torr and about 10 Torr. The substrate is maintained at a temperature between about 300° C. and about 450° C. during the plasma treatment. A substrate temperature between about 350° C. and about 400° C. may be used during the plasma treatment. The plasma treatment may be performed between about 10 seconds and about 100 seconds, with a plasma treatment between about 40 seconds and about 60 seconds preferably used. The processing gas may be introduced into the chamber by a gas distributor, the gas distributor may be positioned between about 200 mils and about 500 mils from the substrate surface. The showerhead may be positioned between about 300 mils and about 400 mils during the plasma treatment. However, it should be noted that the respective parameters may be modified to perform the plasma processes in various chambers and for different substrate sizes, such as 300 mm substrates. An example of a plasma treatment for a silicon and carbon containing film is further disclosed in U.S. patent application Ser. No. 09/336,525, entitled, "Plasma treatment to Enhance adhesion and to Minimize Oxidation of Carbon-Containing Layers," filed on Jun. 18, 1999, which is incorporated herein by reference to the extent not inconsistent with the disclosure and claimed aspects of the invention described herein.

The deposited silicon oxycarbide layer or silicon carbide layer may also be treated by depositing a nitrogen-free silicon carbide cap layer or silicon oxide cap layer prior to depositing a photoresist material. The cap layer may be disposed on a nitrogen doped silicon carbide layer or deposited on a silicon oxycarbide layer disposed in a stack having a nitrogen doped silicon carbide layer. The cap layer may be deposited at a thickness between about 100 Å and about 500 Å. The nitrogen-free silicon carbide may be deposited as describe above.

The silicon oxide cap layer may be deposited by chemical vapor deposition. In one example the silicon oxide cap may be deposited on the silicon oxycarbide material in situ by increasing the oxygen concentration of the process gas. The increased oxygen concentration will remove carbon content from the deposited film as well as density the silicon oxycarbide surface to form a silicon oxide cap. The silicon oxide cap layer may also be deposited by another processes, such as from a tetraethylorthosilicate (TEOS) precursor.

The silicon oxycarbide layer or silicon carbide layer deposition processes described herein and the plasma treatment described herein may be performed in a substrate processing system as described in more detail below.

Exemplary CVD Reactor

Figure 1:
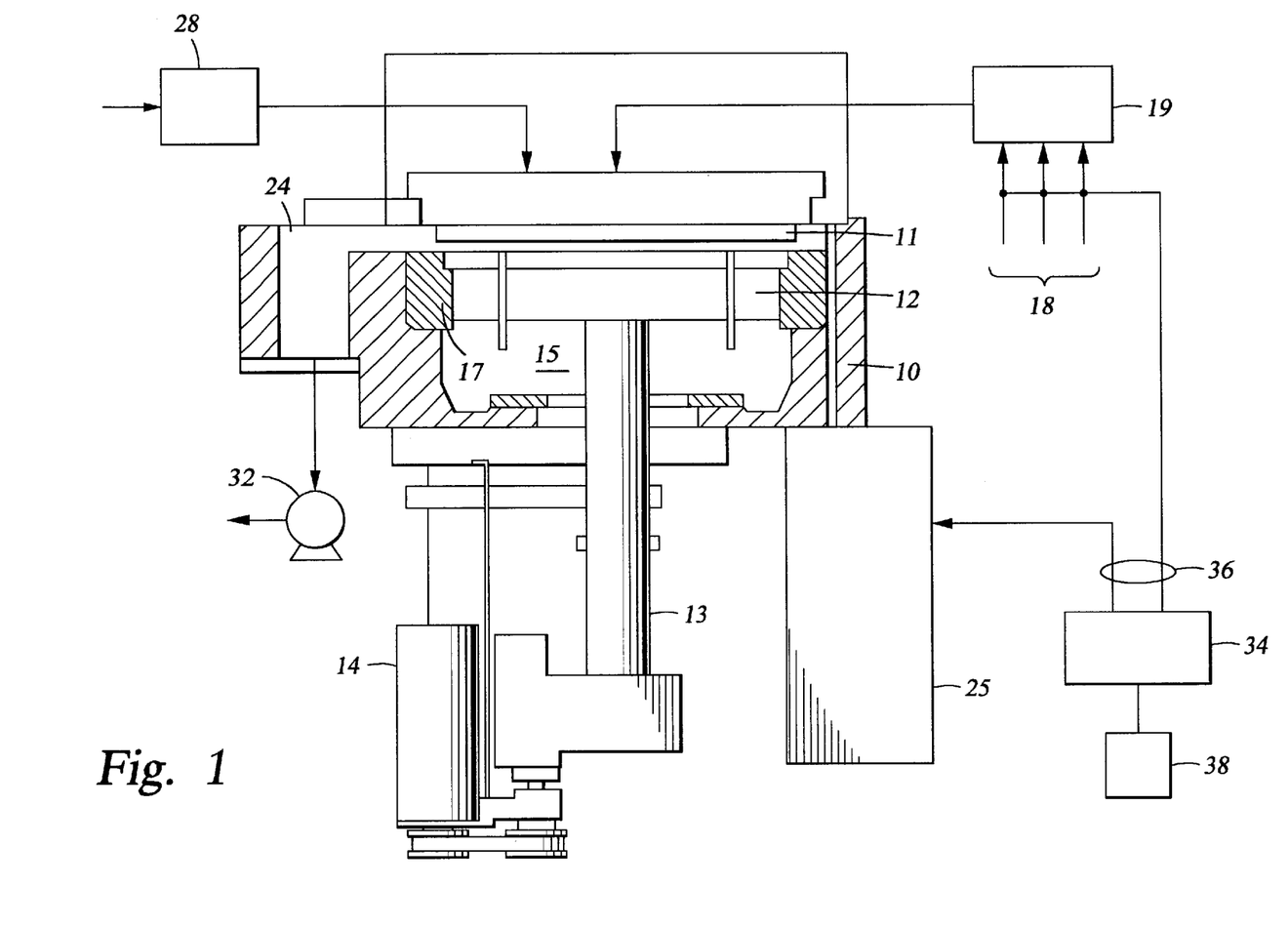
FIG. 1 is a cross-sectional diagram of an exemplary CVD reactor configured for use according to embodiments described herein.

FIG. 1 shows a vertical, cross-section view of a parallel plate chemical vapor deposition processing chamber 10 having a high vacuum region 15. The processing chamber 10 contains a gas distribution manifold 11 for dispersing process gases through perforated holes in the manifold to a substrate or substrate (not shown) that rests on a substrate support plate or susceptor 12 which is raised or lowered by a lift motor 14. A liquid injection system (not shown), such as typically used for liquid injection of TEOS, may also be provided for injecting a liquid organosilicon compound.

The processing chamber 10 includes heating of the process gases and substrate, such as by resistive heating coils (not shown) or external lamps (not shown). Referring to FIG. 1, susceptor 12 is mounted on a support stem 13 so that susceptor 12 (and the substrate supported on the upper surface of susceptor 12) can be controllably moved between a lower loading/off-loading position and an upper processing position which is closely adjacent to manifold 11.

When susceptor 12 and the substrate are in processing position 14, they are surrounded by an insulator 17 and process gases exhaust into a manifold 24. During processing, gases through manifold 11 are uniformly distributed radially across the surface of the substrate. A vacuum pump 32 having a throttle valve controls the exhaust rate of gases from the chamber.

Before reaching manifold 11, deposition and carrier gases are input through gas lines 18 into a mixing system 19 where they are combined and then sent to manifold 11. Generally, the process gases supply line 18 for each of the process gases also includes (i) safety shut-off valves (not shown) that can be used to automatically or manually shut off the flow of process gas into the chamber, and (ii) mass flow controllers (also not shown) that measure the flow of gas through the gas supply lines. When toxic gases are used in the process, several safety shut-off valves are positioned on each gas supply line in conventional configurations.

The deposition process performed in processing chamber 10 can be either a thermal process or a plasma enhanced process. In a plasma process, a controlled plasma is typically formed adjacent to the substrate by RF energy applied to distribution manifold 11 from RF power supply 25 (with susceptor 12 grounded). Alternatively, RF power can be provided to the susceptor 12 or RF power can be provided to different components at different frequencies. RF power supply 25 can supply either single or mixed frequency RF power to enhance the decomposition of reactive species introduced into the high vacuum region 15. A mixed frequency RF power supply typically supplies power at a high RF frequency (RF1) of 13.56 MHz to the distribution manifold 11 and at a low RF frequency (RF2) of 360 KHz to the susceptor 12. The silicon oxycarbide layers of the present invention are most preferably produced using low levels of constant high frequency RF power or pulsed levels of high frequency RF power.

When additional dissociation of the oxidizing gas is desired, an optional microwave chamber 28 can be used to input from between about 0 Watts and about 6000 Watts of microwave power to the oxidizing gas prior to entering the deposition chamber. Separate addition of microwave power would avoid excessive dissociation of the organosilicon compounds prior to reaction with the oxidizing gas. A gas distribution plate having separate passages for the organosilicon compound and the oxidizing gas is preferred when microwave power is added to the oxidizing gas.

Typically, any or all of the chamber lining, distribution manifold 11, susceptor 12, and various other reactor hardware is made out of material such as aluminum or anodized aluminum. An example of such a CVD reactor is described in U.S. Pat. No. 5,000,113, entitled A Thermal CVD/PECVD Reactor and Use for Thermal Chemical Vapor Deposition of Silicon Dioxide and In-situ Multi-step Planarized Process, issued to Wang et al. and assigned to Applied Materials, Inc., the assignee of the present invention.

The lift motor 14 raises and lowers susceptor 12 between a processing position and a lower, substrate-loading position. A system controller 34 controls the motor, the gas mixing system 19, and the RF power supply 25 over control lines 36. The reactor includes analog assemblies, such as mass flow controllers (MFCs) and standard or pulsed RF generators, that are controlled by the system controller 34 which executes system control software stored in a memory 38, which in the preferred embodiment is a hard disk drive. Motors and optical sensors are used to move and determine the position of movable mechanical assemblies such as the throttle valve of the vacuum pump 32 and motor for positioning the susceptor 12.

The system controller 34 controls all of the activities of the CVD reactor and a preferred embodiment of the controller 34 includes a hard disk drive, a floppy disk drive, and a card rack. The card rack contains a single board computer (SBC), analog and digital input/output boards, interface boards and stepper motor controller boards. The system controller conforms to the Versa Modular Europeans (VME) standard that defines board, card cage, and connector dimensions and types. The VME standard also defines the bus structure having a 16-bit data but and 24-bit address bus.

The system controller 34 operates under the control of a computer program stored on the hard disk drive 38. The computer program dictates the timing, mixture of gases, RF power levels, susceptor position, and other parameters of a particular process.

Figure 2:
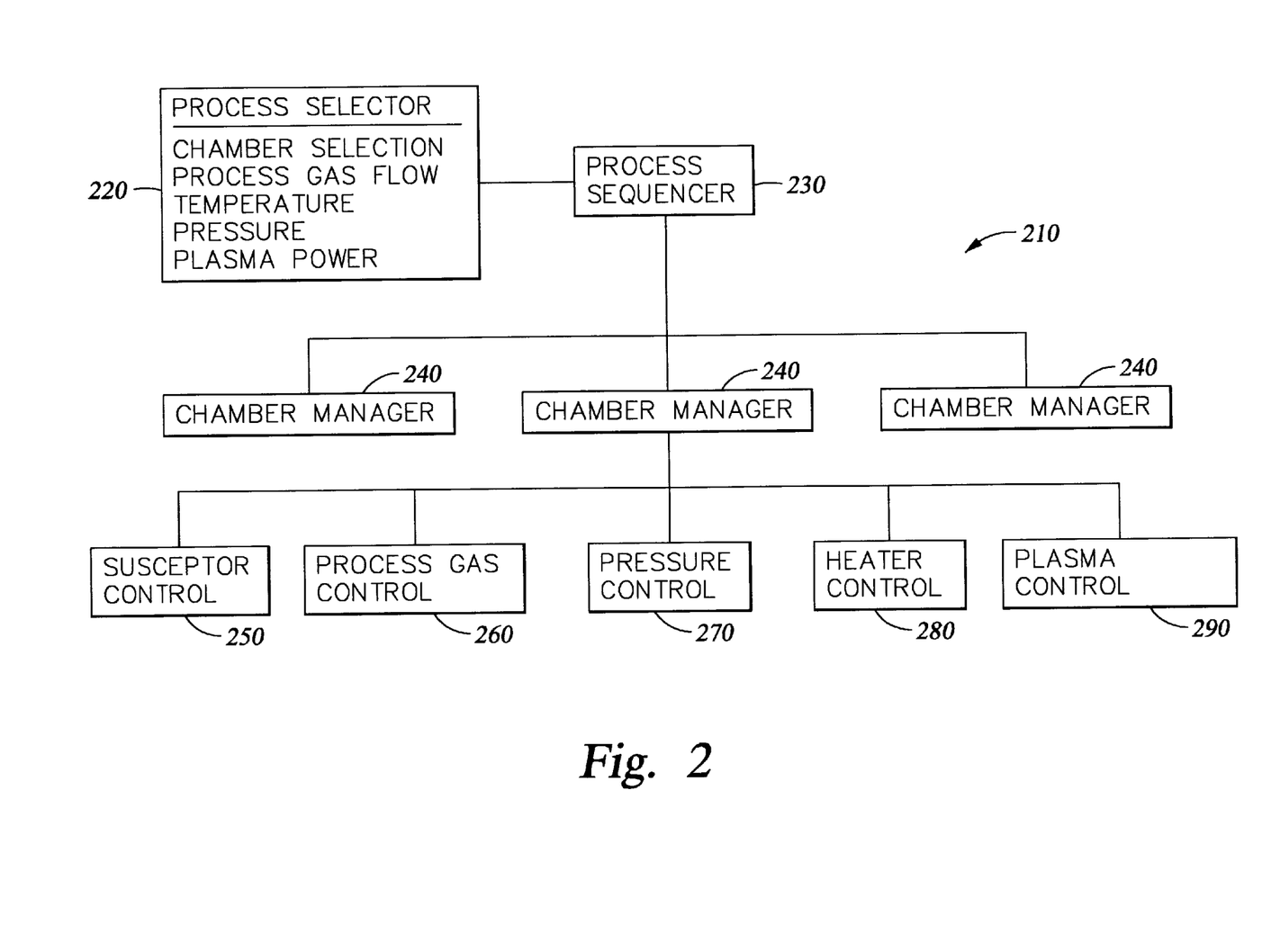
FIG. 2 is a flow chart of a process control computer program product used in conjunction with the exemplary CVD reactor of FIG. 1.

Referring to FIG. 2, the process can be implemented using a computer program product 210 that runs on, for example, the system controller 34. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

FIG. 2 shows an illustrative block diagram of the hierarchical control structure of the computer program 210. A user enters a process set number and process chamber number into a process selector subroutine 220 in response to menus or screens displayed on the CRT monitor by using the light pen interface. The process sets are predetermined sets of process parameters necessary to carry out specified processes, and are identified by predefined set numbers. The process selector subroutine 220 the (i) selects a desired process chamber on a cluster tool such as an Centura® platform (available from Applied Materials, Inc.), and (ii) selects a desired set of process parameters needed to operate the process chamber for performing the desired process. The process parameters for performing a specific process relate to process conditions such as, for example, process gas composition and flow rates, temperature, pressure, plasma conditions such as RF bias power levels and magnetic field power levels, cooling gas pressure, and chamber wall temperature and are provided to the user in the form of a recipe.

The parameters specified by the recipe are entered utilizing the light pen/CRT monitor interface.

The signals for monitoring the process are provided by the analog input and digital input boards of system controller and the signals for controlling the process are output on the analog output and digital output boards of the system controller 34.

A process sequencer subroutine 230 comprises program code for accepting the identified process chamber and set of process parameters from the process selector subroutine 220, and for controlling operation of the various process chambers. Multiple users can enter process set numbers and process chamber numbers, or a user can enter multiple process chamber numbers, so the sequencer subroutine 230 operates to schedule the selected processes in the desired sequence. Preferably the sequencer subroutine 230 includes computer readable program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 230 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 230 determines which process chamber and process set combination is going to be executed next, the sequencer subroutine 230 causes execution of the process set by passing the particular process set parameters to a chamber manager subroutine 240 which controls multiple processing tasks in a process chamber 10 according to the process set determined by the sequencer subroutine 230. For example, the chamber manager subroutine 240 comprises program code for controlling CVD process operations in the process chamber 10. The chamber manager subroutine 240 also controls execution of various chamber component subroutines that control operation of the chamber component necessary to carry out the selected process set. Examples of chamber component subroutines are susceptor control subroutine 250, process gas control subroutine 260, pressure control subroutine 270, heater control subroutine 280, and plasma control subroutine 290. Those having ordinary skill in the art would readily recognize that other chamber control subroutines can be included depending on what processes are desired to be performed in the processing chamber 10.

In operation, the chamber manager subroutine 240 selectively schedules or calls the process component subroutines in accordance with the particular process set being executed. The chamber manager subroutine 240 schedules the process component subroutines similarly to how the sequencer subroutine 230 schedules which process chamber 10 and process set is to be executed next. Typically, the chamber manager subroutine 240 includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 2. The susceptor control positioning subroutine 250 comprises program code for controlling chamber components that are used to load the substrate onto the susceptor 12, and optionally to lift the substrate to a desired height in the processing chamber 10 to control the spacing between the substrate and the gas distribution manifold 11. When a substrate is loaded into the processing chamber 10, the susceptor 12 is lowered to receive the substrate, and thereafter, the susceptor 12 is raised to the desired height in the chamber, to maintain the substrate at a first distance or spacing from the gas distribution manifold 11 during the CVD process. In operation, the susceptor control subroutine 250 controls movement of the susceptor 12 in response to process set parameters that are transferred from the chamber manager subroutine 240.

The process gas control subroutine 260 has program code for controlling process gas composition and flow rates. The process gas control subroutine 260 controls the open/close position of the safety shut-off valves, and also ramps up/down the mass flow controllers to obtain the desired gas flow rate. The process gas control subroutine 260 is invoked by the chamber manager subroutine 240, as are all chamber components subroutines, and receives from the chamber manager subroutine process parameters related to the desired gas flow rates. Typically, the process gas control subroutine 260 operates by opening the gas supply lines, and repeatedly (i) reading the necessary mass flow controllers, (ii) comparing the readings to the desired flow rates received from the chamber manager subroutine 240, and (iii) adjusting the flow rates of the gas supply lines as necessary. Furthermore, the process gas control subroutine 260 includes steps for monitoring the gas flow rates for unsafe rates, and activating the safety shut-off valves when an unsafe condition is detected.

In some processes, an inert gas such as helium or argon is flowed into the processing chamber 10 to stabilize the pressure in the chamber before reactive process gases are introduced into the chamber. For these processes, the process gas control subroutine 260 is programmed to include steps for flowing the inert gas into the chamber 10 for an amount of time necessary to stabilize the pressure in the chamber, and then the steps described above would be carried out. Additionally, when a process gas is to be vaporized from a liquid precursor, for example 1,3,5-trisilano-2,4,6-trimethylene (1,3,5-trisilanacyclohexane), the process gas control subroutine 260 would be written to include steps for bubbling a delivery gas such as helium through the liquid precursor in a bubbler assembly. For this type of process, the process gas control subroutine 260 regulates the flow of the delivery gas, the pressure in the bubbler, and the bubbler temperature in order to obtain the desired process gas flow rates. As discussed above, the desired process gas flow rates are transferred to the process gas control subroutine 260 as process parameters. Furthermore, the process gas control subroutine 260 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 270 comprises program code for controlling the pressure in the processing chamber 10 by regulating the size of the opening of the throttle valve in the exhaust pump 32. The size of the opening of the throttle valve is set to control the chamber pressure to the desired level in relation to the total process gas flow, size of the process chamber, and pumping set point pressure for the exhaust pump 32. When the pressure control subroutine 270 is invoked, the desired, or target pressure level is received as a parameter from the chamber manager subroutine 240. The pressure control subroutine 270 operates to measure the pressure in the processing chamber 10 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 270 can be written to open or close the throttle valve to a particular opening size to regulate the processing chamber 10 to the desired pressure.

The heater control subroutine 280 comprises program code for controlling the temperature of the heat modules or radiated heat that is used to heat the susceptor 12. The heater control subroutine 280 is also invoked by the chamber manager subroutine 240 and receives a target, or set point, temperature parameter. The heater control subroutine 280 measures the temperature by measuring voltage output of a thermocouple located in a susceptor 12, compares the measured temperature to the set point temperature, and increases or decreases current applied to the heat module to obtain the set point temperature. The temperature is obtained from the measured voltage by looking up the corresponding temperature in a stored conversion table, or by calculating the temperature using a fourth order polynomial. The heater control subroutine 280 gradually controls a ramp up/down of current applied to the heat module. The gradual ramp up/down increases the life and reliability of the heat module. Additionally, a built-in-fail-safe mode can be included to detect process safety compliance, and can shut down operation of the heat module if the processing chamber 10 is not properly set up.

The plasma control subroutine 290 comprises program code for setting the RF bias voltage power level applied to the process electrodes in the processing chamber 10, and optionally, to set the level of the magnetic field generated in the reactor. Similar to the previously described chamber component subroutines, the plasma control subroutine 290 is invoked by the chamber manager subroutine 240.

The above CVD system description is mainly for illustrative purposes, and other CVD equipment such as electrode cyclotron resonance (ECR) plasma CVD devices, induction-coupled RF high density plasma CVD devices, or the like may be employed. Additionally, variations of the above described system such as variations in susceptor design, heater design, location of RF power connections and others are possible. For example, the substrate could be supported and heated by a resistively heated susceptor. The pretreatment and method for forming a pretreated layer of the present invention is not limited to any specific apparatus or to any specific plasma excitation method.

Deposition of a Dual Damascene Structure

Figure 3:
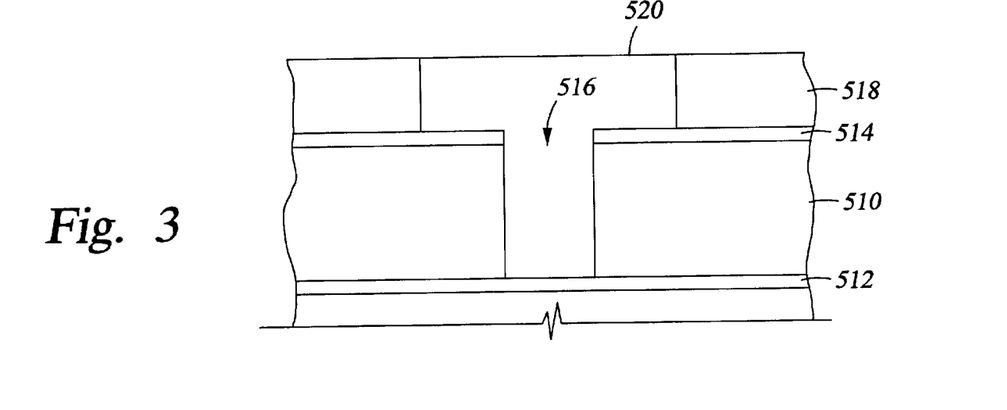
FIG. 3 is a cross sectional view showing a dual damascene structure comprising the silicon carbide and silicon oxycarbide layers described herein.

A damascene structure that is formed using the plasma treatment described herein for a silicon oxycarbide layer disposed on a silicon carbide layer is shown in FIG. 3.

A silicon oxycarbide material is deposited from an oxidized organosilicon compound by the process described herein, as an interlayer dielectric material, such as the first dielectric layer 510. A first silicon carbide barrier layer 512 is generally deposited on the substrate surface to eliminate inter-level diffusion between the substrate and subsequently deposited material. The first silicon carbide barrier layer 512 may be a nitrogen containing silicon carbide layer deposited by introducing a silicon source gas, a carbon source gas, a nitrogen source gas, and a noble gas, generating a plasma in the processing chamber, and reacting the silicon source gas, the carbon source gas, the nitrogen source gas, and the noble gas to deposit the first silicon carbide barrier layer 512. A capping layer of nitrogen free silicon carbide (not shown) may be deposited in situ on the first silicon carbide barrier layer 512 by minimizing or eliminating the nitrogen source gas.

The first dielectric layer 510 of the oxidized organosilicon compound is deposited on a first silicon carbide barrier layer 512 on the substrate surface. The first dielectric layer 510 is then plasma treated according to the process described herein. Alternatively, a silicon oxide cap layer (not shown) may be deposited in situ on the first dielectric layer 510 by increasing the oxygen concentration in the silicon oxycarbide deposition process described herein to remove carbon from the deposited material. An etch stop (or second barrier layer) 514 of a nitrogen doped silicon carbide is then deposited on the first dielectric layer 510. The etch stop 514 may have a nitrogen free silicon carbon capping layer deposited thereon. The etch stop 514 is then pattern etched to define the openings of the contacts/vias 516. A second dielectric layer 518 of an oxidized organosilane or organosiloxane is then deposited over the patterned etch stop.

The second dielectric layer 518 is then plasma treated according to the process described herein or has an silicon oxide cap material disposed thereon by the process described herein. A photoresist, conventionally known in the art, such as UV-5, commercially available from Shipley Company Inc., of Marlborough, Mass., is then deposited and patterned by conventional means known in the art to define the interconnect lines 520. A single etch process is then performed to define the interconnects down to the etch stop and to etch the unprotected dielectric exposed by the patterned etch stop to define the contacts/vias.

Figure 4A:
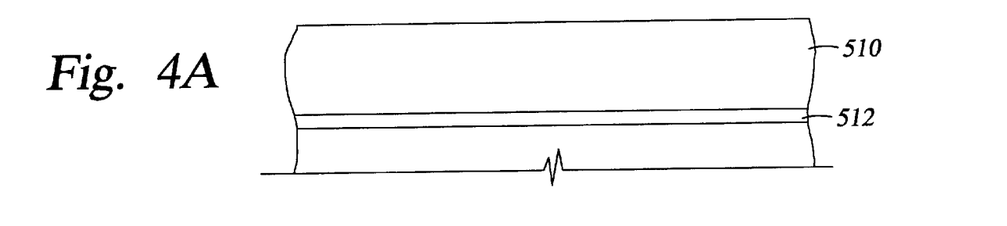
FIGS. 4A–4H are cross sectional views showing one embodiment of a dual damascene deposition sequence of the invention.
Figure 4B:
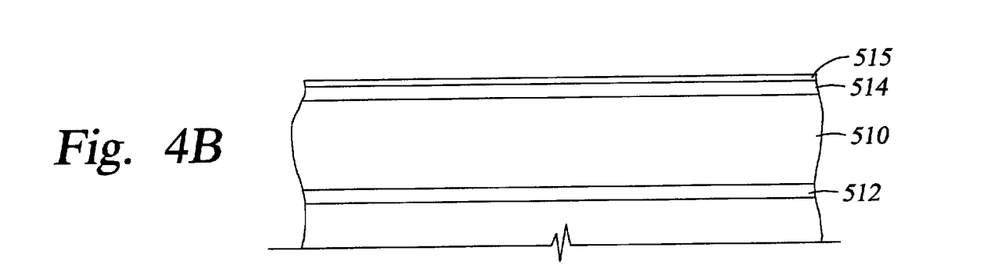
Figure 4C:
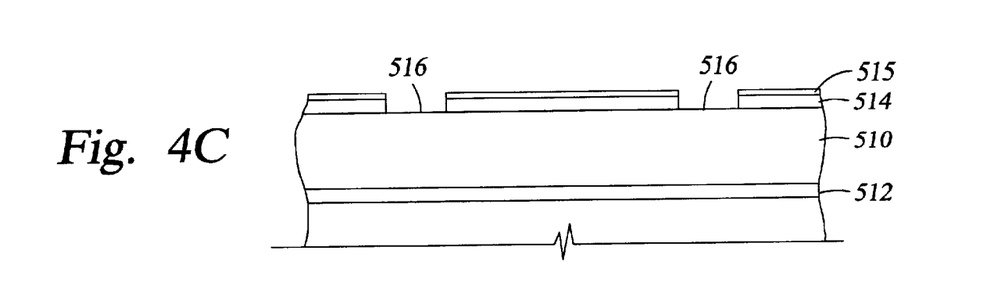
Figure 4D:
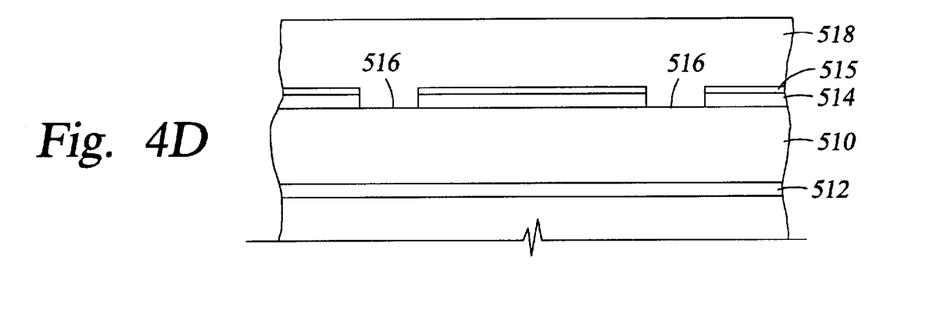
Figure 4E:
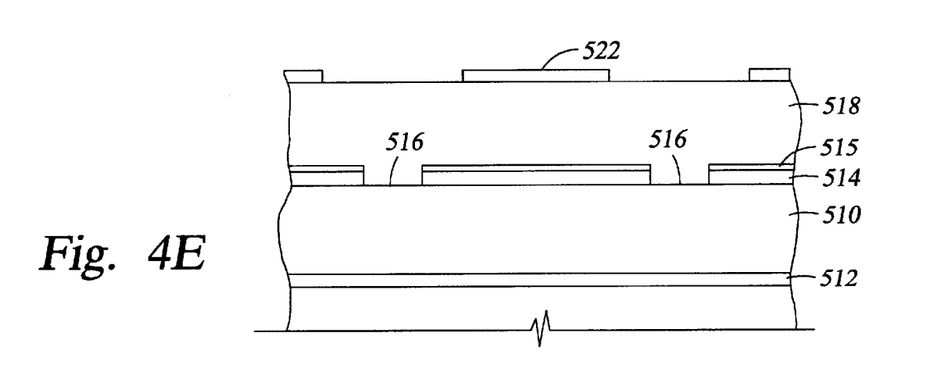

A preferred dual damascene structure fabricated in accordance with the invention includes the plasma treatment of an exposed silicon oxycarbide layer as shown in FIG. 4E, and the method of making the structure is sequentially depicted schematically in FIGS. 4A–4H, which are cross sectional views of a substrate having the steps of the invention formed thereon.

As shown in FIG. 4A, a first silicon carbide barrier layer 512 is deposited on the substrate surface. The silicon carbide material of the first silicon carbide barrier layer 512 may be doped with nitrogen. While not shown a capping layer of nitrogen free silicon carbide may be deposited on the barrier layer 512. The nitrogen free silicon carbide may be deposited in situ by the nitrogen doped silicon carbide process with the source of nitrogen minimized or eliminated during the deposition process.

The first silicon carbide barrier layer 512 may be plasma treated with an inert gas. Helium (He), argon (Ar), neon (Ne), and combinations thereof, may be used for the inert gas. The plasma treatment may be performed in situ with the deposition of the silicon carbide material. Such a plasma treatment is believed to stabilize the layer, such that it becomes less reactive with moisture and/or oxygen under atmospheric condition as well as the adhesion of layers formed thereover.

In general, the following process parameters can be used to plasma treat the first silicon carbide barrier layer 512. The process parameters range from a chamber pressure of about 5 Torr to about 10 Torr, an inert gas flow rate of about 1000 sccm to about 7000 sccm, and a radio frequency (RF) power of about 1 watt/cm$^2$ to about 10 watts/cm$^2$. The silicon carbide layer is plasma treated for less than about 120 seconds.

An initial first dielectric layer 510 of silicon oxycarbide from an oxidized organosilane or organosiloxane by the process described herein, such as trimethylsilane, is deposited on the first silicon carbide barrier layer 512 to a thickness of about 5,000 to about 15,000 Å, depending on the size of the structure to be fabricated. The first dielectric layer my also comprise other low k dielectric material such as a low polymer material including paralyne or a low k spin-on glass such as un-doped silicon glass (USG) or fluorine-doped silicon glass (FSG). The first dielectric layer may then be treated by a plasma process as described herein.

As shown in FIG. 4B, the low k etch stop 514, which may be nitrogen doped silicon carbide is then deposited on the first dielectric layer to a thickness of about 200 to about 1000 Å using trimethylsilane, nitrogen, and low levels of RF power. A capping layer 515 of nitrogen free silicon carbide is then deposited thereon. The capping layer 515 reduces or minimizes nitrogen contamination of subsequently deposited photoresist materials. The nitrogen-free silicon carbide capping layer 515 is deposited to a thickness of between about 100 Å and about 500 Å prior to depositing additional materials, such as photoresist materials. The low k etch stop 514 and the capping layer 515, which comprise silicon carbide materials or silicon oxycarbide materials, may be plasma treated as described herein for the silicon carbide materials or silicon oxycarbide materials.

The low k etch stop 514 is then pattern etched to define the contact/via openings 516 and to expose first dielectric layer 510 in the areas where the contacts/vias are to be formed as shown in FIG. 4C. Preferably, low k etch stop 514 is pattern etched using conventional photolithography and etch processes using fluorine, carbon, and oxygen ions. While not shown, a nitrogen-free silicon carbide or silicon oxide cap layer between about 100 and about 500 may be deposited on the etch stop 516 prior to depositing further materials.

After low k etch stop 514 has been etched to pattern the contacts/vias and the photoresist has been removed, a second dielectric layer 518 of silicon oxycarbide from an oxidized organosilane or organosiloxane by the process described herein, such as trimethylsilane, is deposited to a thickness of about 5,000 to about 15,000 Å as shown in FIG. 4D.

The second dielectric layer 518 is then plasma treated with helium at a power level of between about 600 watts and about 800 watts for between about 40 seconds and about 60 seconds for a 200 millimeter substrate. The processing chamber is maintained at a pressure of about 20 Torr or less and at a substrate temperature of about 450° C. or less during the reactive clean process. The plasma treatment is believed to reduce the reactivity of the surface of the layer 518 to subsequently deposited materials.

In an alternative embodiment, a nitrogen-free silicon carbide or silicon oxide cap layer between about 100 Å and about 500 Å thick may be deposited on second dielectric layer 518 prior to depositing additional materials, such as photoresist materials.

Figure 4F:
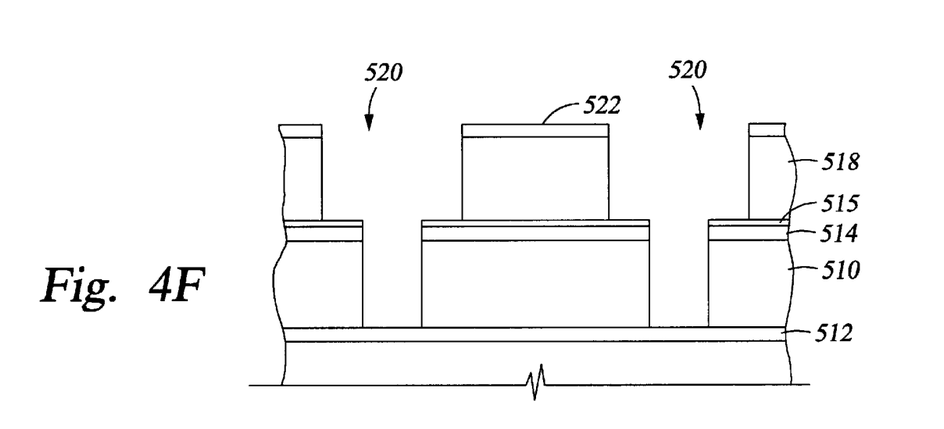

A photoresist material 522 is then deposited on the second dielectric layer 518 (or cap layer) and patterned preferably using conventional photolithography processes to define the interconnect lines 520 as shown in FIG. 4E. The photoresist material 522 comprises a material conventionally known in the art, preferably a high activation energy photoresist, such as UV-5, commercially available from Shipley Company Inc., of Marlborough, Mass. The interconnects and contacts/vias are then etched using reactive ion etching or other anisotropic etching techniques to define the metallization structure (i.e., the interconnect and contact/via) as shown in FIG. 4F. Any photoresist or other material used to pattern the etch stop 514 or the second dielectric layer 518 is removed using an oxygen strip or other suitable process.

Figure 4G:
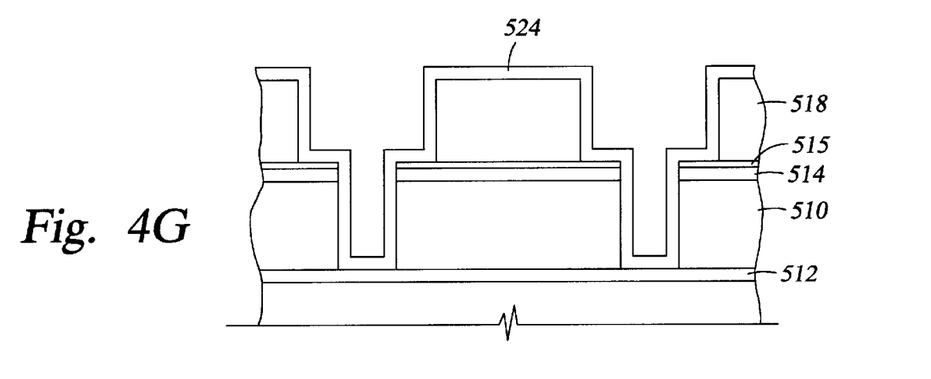
Figure 4H:
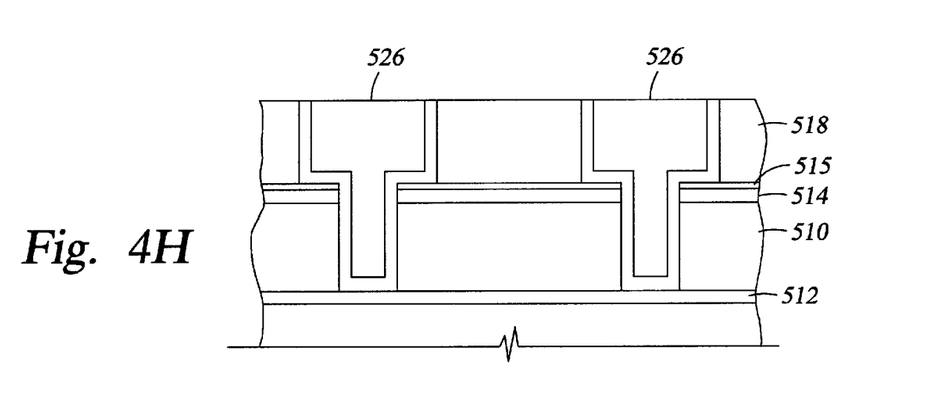

The metallization structure is then formed with a conductive material such as aluminum, copper, tungsten or combinations thereof. Presently, the trend is to use copper to form the smaller features due to the low resistivity of copper (1.7 mW-cm compared to 3.1 mW-cm for aluminum). Preferably, as shown in FIG. 4G, a suitable barrier layer 524 such as tantalum nitride is first deposited conformally in the metallization pattern to prevent copper migration into the surrounding silicon and/or dielectric material. Thereafter, copper 526 is deposited using either chemical vapor deposition, physical vapor deposition, electroplating, or combinations thereof to form the conductive structure. Once the structure has been filled with copper or other metal, the surface is planarized using chemical mechanical polishing, as shown in FIG. 4H.

EXAMPLES

The following examples demonstrate plasma treatment of a deposition of organosilane or organosiloxane films having excellent barrier properties. These examples were undertaken using a chemical vapor deposition chamber, and in particular, a "CENTURA DxZ" system which includes a solid-state RF matching unit with a two-piece quartz process kit, both fabricated and sold by Applied Materials, Inc., Santa Clara, Calif.

Silicon Oxycarbide Surface Treatment Process

An oxidized trimethylsilane film was deposited at a chamber pressure of 4.0 Torr and a temperature of 350° C. from reactive gases which were flowed into the reactor as follows:

| | |
|---|---|
| Trimethylsilane, (CH$_3$)$_3$SiH, at | 600 sccm |
| Oxygen, O$_2$, at | 100 sccm |
| Helium, He, at | 0 sccm |

The substrate was positioned 220 millimeters from the gas distribution showerhead and 600 W of high frequency power (13.56 MHz) was applied to the showerhead for plasma enhanced deposition of an oxidized trimethylsilane layer at an observed rate of about 7000 Å/minute. The substrate was then spaced from the gas distribution showerhead at a distance of about 350 mils and exposed to a plasma treatment for 20 seconds by flowing He at 2800 sccm and generating a plasma by applying a RF power of about 750 watts while maintaining a chamber pressure of about 8.7 Torr and a substrate temperature of about 350° C. A photoresist was then deposited and patterned. The photoresist was then examined and had minimal or no photoresist poisoning.

Silicon Carbide Two-Step Deposition Process

A nitrogen silicon carbide film and a silicon carbide film were deposited in situ. The silicon carbide film was deposited between the nitrogen silicon carbide film and a subsequently deposited photoresist. The nitrogen silicon carbide film was deposited at a chamber pressure of 3.0 Torr and a temperature of 350° C. from reactive gases which were flowed into the reactor as follows:

| | |
|---|---|
| Trimethylsilane, (CH$_3$)$_3$SiH, at | 160 sccm |
| Ammonia, NH$_3$, at | 325 sccm |
| Helium, He, at | 400 sccm |

The substrate was positioned 320 millimeters from the gas distribution showerhead and 300 W of high frequency power (13.56 MHz) was applied to the showerhead and the nitrogen silicon carbide film was deposited for 40 seconds. The ammonia flow was reduced to 0 sccm and the process continued for about 10 seconds to deposit a nitrogen-free silicon carbide film thereon. A photoresist was then deposited and patterned. The photoresist was then examined and had minimal or no photoresist poisoning.

While the foregoing is directed to preferred embodiments of the present invention, other and further embodiments of the invention may be devised without departing from the basic scope thereof, and the scope thereof is determined by the claims which follow.

What is claimed is:

1. A method for processing a substrate, comprising:
    depositing a nitrogen-doped dielectric layer on the substrate;
    depositing a dielectric layer comprising silicon and carbon on the nitrogen-doped dielectric layer;
    treating a surface of the dielectric layer comprising silicon and carbon by exposing the dielectric layer comprising silicon and carbon to a plasma of an inert gas; and
    depositing a photoresist on the dielectric layer comprising silicon and carbon.

2. The method of claim 1, further comprising:
    patterning and etching the photoresist layer to expose the dielectric layer comprising silicon and carbon; and then
    etching the dielectric layer comprising silicon and carbon to form at least a portion of a damascene definition.

3. The method of claim 2, further comprising depositing one or more conductive materials in the damascene definition to form a damascene structure.

4. The method of claim 1, wherein the inert gas comprises argon, helium, neon, xenon, or krypton, or combinations thereof.

5. The method of claim 4, wherein the processing gas is introduced into a processing chamber at a flow rate of about 3000 sccm or less.

6. The method of claim 1, wherein the plasma is generated at a power level between about 200 and about 800 watts.

7. The method of claim 6, wherein plasma is generated at a chamber pressure between about 3 Torr and about 12 Torr.

8. The method of claim 6, wherein the substrate is maintained between about 300° C. and about 450° C. when exposing the dielectric layer comprising silicon and carbon to a plasma of a processing gas.

9. The method of claim 6, wherein the dielectric layer comprising silicon and carbon is exposed to the plasma for between about 10 and about 100 seconds.

10. The method of claim 1, wherein exposing the dielectric layer comprising silicon and carbon to a plasma of an inert gas comprises introducing helium, argon, neon, xenon, krypton, or combinations thereof, into the processing chamber at a flow rate of about 3000 sccm or less, maintaining the processing chamber at a pressure of between about 7 Torr and about 10 Torr, maintaining the substrate temperature between about 300° C. and about 450° C., generating the plasma by supplying a power level for a 200 mm substrate between about 200 watts and about 800 watts to the processing chamber, and maintaining the plasma between about 40 and about 60 seconds.

11. The method of claim 1, wherein the dielectric layer comprising silicon and carbon is nitrogen-free silicon carbide or silicon oxide.

12. The method of claim 1, wherein the dielectric layer comprising silicon and carbon comprises a dielectric layer comprising silicon, oxygen, and carbon deposited on the substrate by chemical vapor deposition, wherein the dielectric layer comprising silicon, oxygen, and carbon has a carbon content between about 5 and about 30 atomic percent excluding hydrogen atoms.

13. A method for processing a substrate, comprising:
    depositing a first dielectric layer comprising silicon, carbon, and nitrogen on the substrate;
    depositing a nitrogen-free silicon containing material in situ on the dielectric layer;
    depositing a second dielectric layer comprising silicon, oxygen, and carbon on the nitrogen-free silicon containing material by chemical vapor deposition; and
    depositing a photoresist on the second dielectric layer.

14. The method of claim 13, further comprising:
    treating a surface of the second dielectric layer by exposing the second dielectric layer to a plasma of a processing gas prior to depositing a photoresist on the dielectric layer comprising silicon, oxygen, and carbon.

15. The method of claim 14, wherein exposing the second dielectric layer to a plasma of a processing gas comprises introducing an inert gas of helium, argon, neon, xenon, krypton, or combinations thereof, into the processing chamber at a flow rate of about 3000 sccm or less, maintaining the processing chamber at a pressure of between about 7 Torr and about 10 Torr, maintaining the substrate temperature between about 300° C. and about 450° C., generating the plasma by supplying a power level for a 200 mm substrate between about 200 watts and about 800 watts to the processing chamber, and maintaining the plasma between about 40 and about 60 seconds.

16. The method of claim 13, further comprising:
    patterning and etching the photoresist layer to expose the second dielectric layer; and
    etching the second dielectric layer to form at least a portion of a damascene definition.

17. The method of claim 16, further comprising depositing one or more conductive materials in a portion of the damascene definition to form a damascene structure.

* * * * *